United States Patent
MacChesney et al.

[11] Patent Number: 6,007,685
[45] Date of Patent: *Dec. 28, 1999

[54] DEPOSITION OF HIGHLY DOPED SILICON DIOXIDE FILMS

[75] Inventors: John Burnette MacChesney, Lebanon; Aza E. Mishkevich, Bridgewater; Henry Miles O'Bryan, Plainfield; Eliezer M. Rabinovich, Berkeley Heights; Ofer Sneh, Branchburg, all of N.J.

[73] Assignee: Lucent Technologies Inc., Murray Hill, N.J.

[*] Notice: This patent issued on a continued prosecution application filed under 37 CFR 1.53(d), and is subject to the twenty year patent term provisions of 35 U.S.C. 154(a)(2).

[21] Appl. No.: 08/878,579

[22] Filed: Jun. 19, 1997

[51] Int. Cl.$^6$ ................................. C23C 14/34
[52] U.S. Cl. ................ 204/192.23; 204/192.15; 501/12; 423/338
[58] Field of Search ................ 204/192.15, 192.23; 501/12; 423/338

[56] References Cited

U.S. PATENT DOCUMENTS

| | | | |
|---|---|---|---|
| 3,959,174 | 5/1976 | Winyall et al. | 252/317 |
| 4,663,008 | 5/1987 | Takeoka et al. | 204/192.26 |
| 4,786,618 | 11/1988 | Shoup | 501/12 |
| 4,940,523 | 7/1990 | Takeshima | 204/192.12 |
| 5,196,382 | 3/1993 | Hench et al. | 501/12 |
| 5,215,943 | 6/1993 | Anderson et al. | 501/12 |
| 5,232,569 | 8/1993 | Nelson et al. | 204/192.15 |
| 5,240,488 | 8/1993 | Chandross et al. | 65/3.11 |
| 5,427,665 | 6/1995 | Hartig et al. | 204/192.12 |
| 5,637,507 | 6/1997 | Wicks et al. | 436/166 |

FOREIGN PATENT DOCUMENTS 2-194169  7/1990  Japan ................ C23C 14/34

*Primary Examiner*—Nam Nguyen
*Assistant Examiner*—Steven H. VerSteeg

[57] ABSTRACT

The specification describes sputtering processes for the deposition of silicon dioxide films doped with high levels of oxides or other materials to alter the optical and/or electrical characteristics of the films. Sol gel methods are used to prepare composite sputtering targets of ultra fine mixtures of materials so the composition of the sputtered films replicate the composition of the target.

7 Claims, 1 Drawing Sheet

DEPOSITION OF HIGHLY DOPED SILICON DIOXIDE FILMS

FIELD OF THE INVENTION

The invention relates to sputtering processes for the deposition of silicon dioxide films doped with high levels of other materials to alter the optical and/or electrical characteristics of the films. More specifically, it includes techniques for preparing composite sputtering targets useful in the sputtering processes.

BACKGROUND OF THE INVENTION

Silicon dioxide thin films are ubiquitous in semiconductor technology and have been since its inception. There is an immense background of experience and technology in processes for depositing $SiO_2$ thin films, and for their application. The uses have been primarily for dielectric layers for semiconductor passivation, for defining localized impurity regions in semiconductor processing, and for interlevel dielectrics. In optical device technology $SiO_2$ is a principal waveguide material, and is used in combination with other optical materials, both passive and active. These films have been deposited by evaporation, chemical vapor deposition, and sputtering.

Modifying electrical properties of $SiO_2$ using various dopants is a technique widely used in semiconductor technology. By implanting $SiO_2$ layers with n- or p-type dopants, the surface characteristics of silicon beneath the $SiO_2$ layers can be altered. Relatively small doses of dopants, well within the capability of conventional ion implantation methods, are useful in producing these electrical effects.

Applications in optical device technology have been proposed for doped oxide films to alter e.g. electronic conductivity, ionic mobility, refractive index, but the doping levels to achieve useful results in some of these applications are high, and some of the desired dopant species, e.g. oxides, are unconventional in the context of standard ion implantation methods. Moreover, some optical applications require high compositional uniformity in the doped material, a result not typically obtained using the methods commonly used for semiconductor processing.

Doped $SiO_2$ films can have altered ionic mobility with a wide range of activation energies. In particular, lower voltage drift can be achieved if ionic mobility is suppressed (i.e. In or P doping). In contrast, $V_2O_5$ doped $SiO_2$ films have a very high ionic mobility making these films suitable as solid electrolytes.

Electronic conductivity can be increased by several orders of magnitude when $SiO_2$ thin films are lightly doped with In, Al, Ti, etc. with only minor changes of the dielectric constant and the index of refraction. Consequently, the electrical properties of high silica dielectric materials can be tailored to a specific application. A well controlled variation in the index of refraction is also possible and may be used for waveguide applications. Multivalent elements may be electrochromic when doped into silica. They can be used as lightvalves, or for display applications.

Many compositions of interest for optical device applications are not stable in the glass form. Therefore, a popular approach for preparing such films is to sputter the composite film from a target composed of tiles of the individual component materials. The fractional area of the individual targets are adjusted using the respective sputtering yields to result in the film composition desired. Unfortunately, the sputtering yields of different materials shows remarkably different dependence on the deposition parameters (such as rate, pressure, plasma potential, reactive gases, etc.). Therefore it is difficult to optimize deposition conditions to control film properties such as stress, hermeticity, moisture resistance, grain size, etc. as well as reduce particle formation and process cost, and still produce the desired composition.

An approach that is designed to overcome some of these deficiencies is to co-sputter the films from individual targets of component materials using separate sputtering controls for each target. This method is complex and expensive. The physical arrangement of the targets adds further complications due to the variations in distance and angle between the individual targets and the substrate, resulting in shadowing effects when surface mobility is limited and deposition rates vary significantly (as is common with doped silica films).

Theoretically, the best approach is to sputter from a composite target, Which is composed of fine particles of materials having the different compositions. Each material may be vitreous or crystalline and have one or several glassy or crystalline phases. If the particles are sufficiently small, and if the sputtering process is allowed a transition period to a steady state sputtering condition, the composition of the composite target is reproduced in the sputtered film. Due to the rapid formation of the film it remains in the vitreous state.

However, while this sputtering process would appear to be highly attractive for commercial manufacture, sputtering targets with mixed compositions of interest are not available with the requisite compositional uniformity and particle size. This is especially the case with highly doped silica targets. To date, conventional methods for target preparation, typically ceramic or glass forming methods, cannot produce targets with high silica content and sufficiently small particle size to allow replication of the target composition in the sputtered films. Attempts to overcome the particle size limitation by using powder targets have been tried. However, powder sputtering targets are difficult to cool, which makes them suitable only for low rate deposition, and can only be used in apparatus in which the sputtering direction is vertically upward.

In summary, while sputtering from a composite target would appear to be the best process for preparing doped silica films, the lack of suitable targets makes this process solution commercially unattractive.

SUMMARY OF THE INVENTION

We have developed a process for sputtering doped silica films from a composite target in which the sputtered film is uniform in composition and replicates the composition of the composite target. A key ingredient in the process is the use of a composite target with fine particle size produced by sol-gel techniques. Although sol-gel processes have been used to produce large pure silica vitreous bodies, they have not been used to prepare large bodies of mixed oxides useful as targets for sputtering films with compositions of interest in e.g. optical device technologies.

High silica thin films are not subjected to the phase restrictions of bulk glass. In particular, high density and high quality films can be produced by sputtering when annealed at relatively low (500–650° C.) temperatures. These films can be controlled to achieve high mixing glass-like amorphous materials with metastable composition with a wide range of doping levels and materials. While the term doping is used herein as a descriptive term of art, the materials of primary interest are basically mixtures of compounds in which silica is the primary ingredient, i.e. defined here as $SiO_2$ >30 mole %, and usually >50 mole %. Other materials, typically oxides, are present in these compositions in amounts greater than typical dopants, i.e greater than 1 mole % of the composite, and usually much greater than 3 mole % of the composite.

DETAILED DESCRIPTION

The first part of the process to be described is the preparation of the sputtering target by sol-gel methods. As mentioned above, large silica bodies have been prepared using sol-gel methods. Basically, the approach is to gel an aqueous liquid sol, dry the sol, and fire the dried body to form a dense, glass-like, self supporting body. Problems with shrinkage of the gel during drying, resulting in large dimensional variations of the dried body, and cracking and disintegration of the dried body during firing, are well known. Techniques for overcoming these problems are described in U.S. Pat. No. 5,379,364.

The success of the prior process for producing pure vitreous silica bodies does not suggest or predict whether a sol-gel process using mixed oxides will succeed. It is known that vitreous silica bodies, with even minor admixture of alkali or other constituents crystallize during sintering forming crystobalite. Crystobalite, in turn, transforms at 230° C. to α quartz and undergoes a high volume change. This results in disintegration of the body into small pieces. It would be expected that the addition of other oxides to the silica body would only further promote disintegration, so attempts to produce mixed oxides using sol-gel techniques would not appear promising.

We have however succeeded in producing highly dense, mixed oxide bodies, with surprising structural integrity. These bodies have sufficient strength to allow handling, grinding, polishing, and installation in a sputtering apparatus, and to withstand thermal shocks during the sputtering process, e.g. target cooling. Targets with compositions of up to 10 mole % of $TiO_2$, $Al_2O_3$, $In_2O_3$, $WO_4$, and CaO were prepared and successfully sputtered to demonstrate the principles of the process.

The mixtures in this list are illustrative of composites useful in the invention. Other compounds that may be included are $V_2O_5$, $B_2O_3$, $Ta_2O_5$, MgO, CaO, SrO, BaO, $ZrO_2$, $WO_3$, $P_2O_5$, ZnO, CdO and mixtures thereof.

Figure 1:
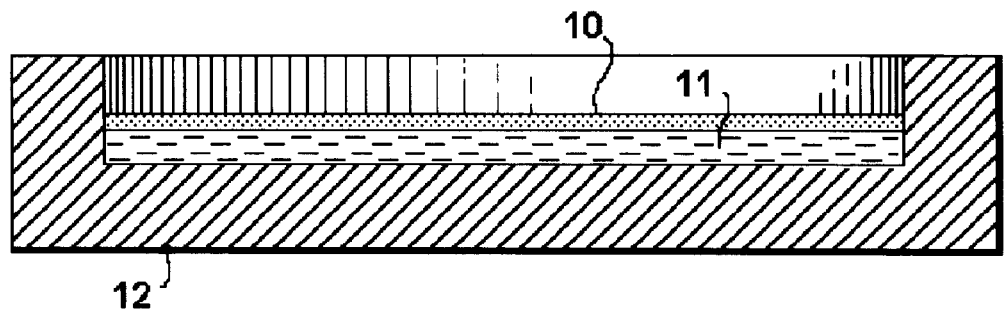
FIG. 1 is a schematic representation of a flotation bed apparatus used in the process of forming sputtering targets.

The process for preparing targets from the mixed compositions listed above was conducted using the following procedure, and with an apparatus like that shown in FIG. 1. With reference to FIG. 1, a flotation bed mold apparatus used for initially drying the gel is shown in a schematic sectional view. The sol/gel is shown at 10, supported by a denser support liquid 11. The container 12 is formed of a material chosen to have low adhesion to the gel, e.g., polyethylene, or it may be made of metal coated with, e.g., a Teflon film. The process proceeds as follows:

1. The silica sol is prepared by intense mixing a silica powder with water. Particle size may be in the range of 10 to 200 m²/g. Examples are various kinds of fumed silica sold under trade names Aerosil™ or Cab-O-Sil™. Alternatively, a commercially available ready silica sol may be used. Typical concentration levels in the sol are 30–70% by weight, and a higher amount is beneficial, because it reduces shrinkage of the gel body. Fine powders of other oxides or their mixtures are added in the silica sol, and to preserve the fluidity some additional water may be added to preserve approximately the same solid-to-water ratio as in the pure silica sol. The pH of the mixture was adjusted using tetramethylammonium hydroxide (TMAH), or another water soluble base, to a pH level in the range 10–13, typically 12.

2. The above prepared mixture was gelled by lowering the pH over several minutes using 5–20 g, typically 10 g, of methyl formate (MF) or another acidic media. The pH objective is approximately 9. Due to large shrinkage of the gel upon drying, it is preferred that the drying step be implemented using flotation casting as described in U.S. Pat. No. 5,643,346. After adding the gelling agent, and before substantial gelling occurs, the sol is cast onto a bed of heavy oil, e.g. Halocarbon oil No. 0.8. Other suitable flotation bed materials are tetrachloroethylene, mercury, or a polychlorotrifluoroethylene. See U.S. Pat. No. 5,643,346.

3. Upon gelation, the gel is separated from the walls using an edging tool to allow free shrinkage on the flotation bed. To prevent too rapid drying, and excessive shrinkage and warping, the mold of the flotation bed is loosely covered with a plastic film, and drying is allowed to continue for 1–3 weeks.

4. After shrinkage is completed, the partially dried body is removed from the bed and is further dried in air.

5. Several dried pieces are then packed together and heated very slowly to a temperature above 900° C. and preferably approximately 1100° C. to burn out all organics, and to strengthen the material for further handling. At this point the body has sufficient integrity to be cut, using e.g. a saw, to a preliminary shape and size for the target.

6. The final firing step is then performed with the body under heavy load to preserve the flatness of the body in the process of final densification. It is preferred, but not essential, to conduct this final firing operation in helium, which is found to contribute to a higher density body. The temperature of this firing step is generally in excess of 1000° C., and preferably in the range 1200° C. to 1350° C. After firing is complete, which usually requires at least 4 hours, the fired material is cooled slowly, e.g. 5° C./min., to room temperature to avoid excessive thermal shock.

7. The final pieces may be cut with a suitable saw (diamond, carborundum) if desired, and polished to form a body suitable for the sputtering target.

Because of the relative precision of this sol-gel process, significant machining of the parts is generally unnecessary. A typical size for a target produced by this technique, and useful in a variety of sputtering processes, is 2"×5", but much larger panels can be produced as well, e.g. 10×20". Plates of this material may be mounted together to increase the surface area of the target.

Targets prepared by the techniques just described were used to sputter composite films with the target composition.

In the preferred sputtering embodiment the target pieces are mounted on standard Cu backing plates of Planar RF Magnetron sputtering cathodes. Bonding is achieved by metallization of the back side of the target pieces. The metallized target pieces should preferably include an adhesion layer, a diffusion barrier layer, and a noble metal layer, e.g. a stack of Ti/TiN/Ti/Au or Cr/Pt/Au or other combinations known in the art.

Bonding is preferably achieved by low-temperature indium alloy metallic brazing. Other methods such as thermally conductive epoxy are also suitable. Target material thickness may vary. However, for high rate deposition 0.15 inch thick pieces are recommended. The water cooled target can be used with any type of sputtering source such as diode, triode, and various types of magnetrons. In the preferred embodiment, a planar magnetron is used. A partially oxidizing atmosphere is preferred although deposition was also conducted in pure Ar. Typically argon to oxygen ratios in the range 9:1 to 3:1 were applied. Deposition pressure is determined by the apparatus, and the type of sputtering source. Using a planar magnetron, pressures can be in the range 1–6 mTorr and typical pressures used were in the range 3–6 mTorr.

Deposition is carried out by RF sputtering. RF power varies with the application, the desired film properties and the deposition rate. For thin films slow deposition rates may be preferred in order to obtain better thickness control. RF power densities up to 100 W/in$^2$ were employed in the apparatus described here. Deposition rates as high as 100 Angstroms/min, with a duty cycle of 1, were demonstrated. Target to substrate spacing varies with the application and the apparatus. In the apparatus described a spacing of approximately 120 mm was suitable. The target wear profile appears to be normal without development of "black spots", pitting or compositional fractionation. The wear pattern on the planar magnetron resembles the expected "race-track" shape following the shape of the permanent magnet. The surface of the worn-out area appears to be smoother than the original surface of the mechanically polished target pieces.

Figure 2:
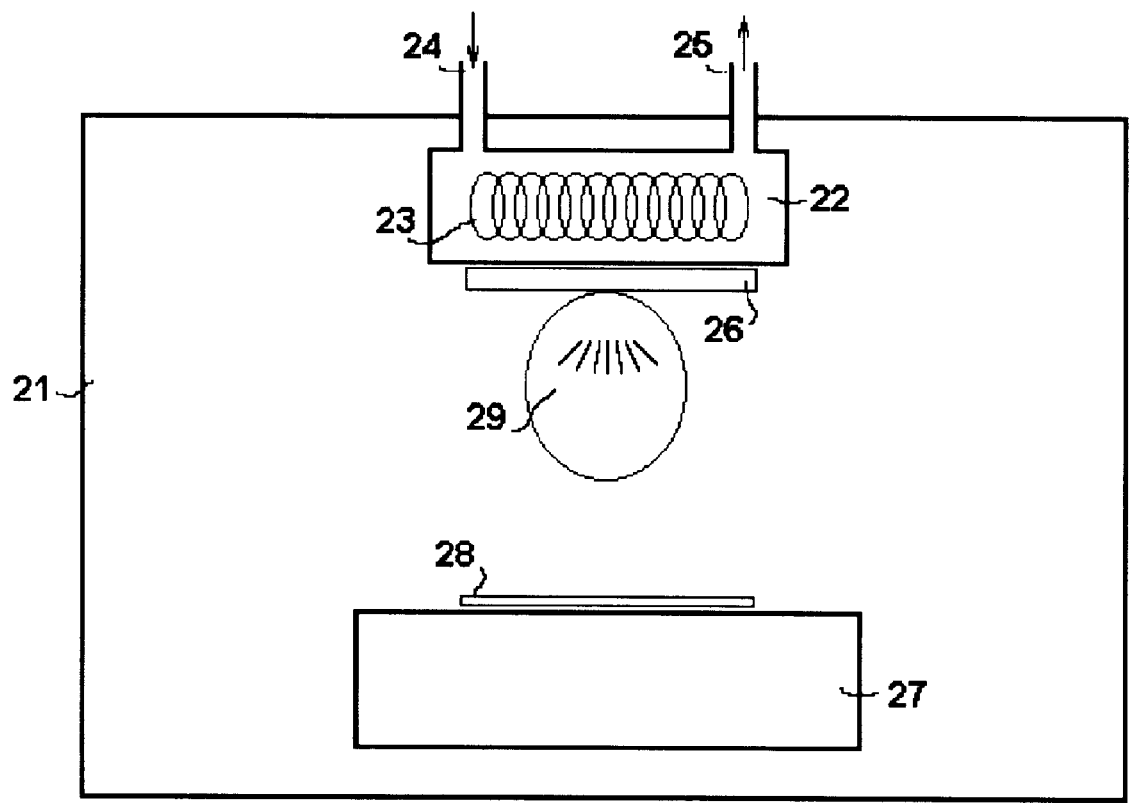
FIG. 2 is a view of a typical magnetron sputtering apparatus useful for carrying the process of the invention.

A suitable sputtering apparatus of the kind just described in shown in FIG. 2. FIG. 2 is a schematic representation of a magnetron sputtering apparatus with vacuum chamber 21 enclosing the sputtering source and the substrate to be coated. The source comprises a permanent ring magnet, shown here schematically as magnet 23, enclosed within housing 22. The housing is typically of a conductive material such as OFHC copper. The housing is typically water cooled via inlet and outlet 24 and 25. The target 26 is attached to the other side of the magnet assembly as shown. The substrate 28 is shown supported by platform 27. The plasma is indicated schematically at 29. The size of the target, size of the substrate being coated, and distance between the target and substrate should be chosen so that the substrate is exposed to the flux of sputtered material from the target. With the proper choice of these parameters the sputtered layer will be highly uniform. For large areas, uniformity can be improved by proper design of the source. For example, multiple ring magnets can be used to create multiple erosion rings across the area of the target.

When the magnetron is biased (by means not shown) the combination of the electric and magnetic fields confines the motion of charged particles into orbital motion. The trajectories of the motion, as well as the orbital radius for the light electrons, confines the electron motion into a ring located below the magnetron surface. The high concentration of electrons in a relatively small confined volume can sustain a plasma at that volume in pressures as low as ~1 mTorr. The plasma results from electron impact ionization of gas species which competes with various plasma quenching mechanisms. In the plasma, the sputtering gas, typically argon or nitrogen, is ionized. Reactive gases can also be used for reactive sputtering in the process of the invention.

During the sputtering operation, plasma particles (electrons, ions, neutral atoms and molecules) impinge on the surface of the target. Due to their small mass, electrons are traveling faster than ions. As a result, exposed surfaces, e.g. the target surface, receive a much larger flux of negative charge and these surfaces quickly become negatively charged. Under steady state, the target surface is charged negatively at a constant bias called the sheath potential. This surface therefore repels electrons and attracts ions. Under typical plasma conditions the sheath potential is almost equal to the bias of the magnetron and the plasma is therefore neutral. The width of the sheath region depends on the plasma density which is a function of the magnetron geometry and the plasma power, and on the mass of the ionic species. The plasma can be sustained by a DC bias if the target is made of conductive material (with p typically smaller than 0.1 Ωcm). In this case a DC current flows from the target to ground through the plasma to convert electrical power to plasma excitation. When the target is made of a poor conductor, or insulator, as in this invention, the target is biased by an oscillating (typically RF) voltage. If the plasma impedance is properly matched with the transmission line an efficient power transfer (without DC current) to plasma excitation is possible. In actuality, the sheath potential oscillates around the DC sheath potential level but the ions are too slow to respond to the AC component.

Ions attracted by the sheath potential (hundreds to thousands of volts) impinge on the target atoms and transfer their momentum. As a result, atoms are ejected from the target surface. With the proper arrangement of target and substrate the ejected atoms deposit on the substrate. The erosion pattern on a planar magnetron target will resemble the shape of the plasma ring. Following a sputtering event the ejection yield depends on the surface atoms, the mass and the kinetic energy of the impinging ions, and the bond strength of the atoms at the target surface. Under typical conditions, only the atoms at the surface layer are ejected and therefore differentiation of the bulk material (which is characteristic of evaporation processes) does not occur. This makes sputtering preferred over evaporation as a technique for depositing thin dielectric films and compound materials.

When a material is sputtered from a composite target it is advantageous for the particles in the target to be small, i.e. less than 200 μm, and preferably less than 100 μm. Even in this case the initial stage of the sputtering process yields a time varying composition because the sputtering yields of various components in the target are different. As a result the surface of the target is initially depleted of the those constituents that have high yields. This depletion results in a decrease of the fractional component of those constituents in the top layer of the sputtered materials. After a transition period, which may be 5–60 minutes, a steady state is reached where the composition of the sputtered material is equal to the bulk composition of the composite target. At this stage the surface depletion of the higher sputtering yield constituents ceases, because the fractional abundance of the constituents, times the sputtering yields of the constituents, is equal to the target composition. At this point the target erodes evenly, and the composition of the deposited film replicates precisely the composition of the target.

As a typical example, a sputtering target is made with three different oxides: $Ox_1$, $Ox_2$, and $OX_3$. These oxides have a bulk distribution, $C_1$, $C_2$, and $C_3$ in the target with $C_1+C_2+C_3=1$. The different oxide materials have different sputtering yields given by $Q_1$, $Q_2$, and $Q_3$. The initial distribution of the three materials on the surface of the target is identical to the bulk distribution, $C(s)_i=C_i$. At the beginning of the sputtering process (t=0) the flux of sputtered material has the composition:

$$X_i = \frac{C_i Q_i}{\sum_{j=1}^{3} C_j Q_j}$$

where X is the fractional composition, i is an index for the three components running from 1–3, and j is also a running index. Therefore, the initial abundance of the materials with the higher sputtering yields–Q in the flux of sputtered material is higher than the bulk distribution. However, this higher flux is depleting these materials from the surface causing a reduced surface concentration $(C(s)_i \neq C_i$. The modified $C(s)_i$ values will affect the abundance of the different materials in the sputtered flux:

$$X_i = \frac{C(s)_i Q_i}{\sum_{j=1}^{3} C(s)_j Q_j}$$

The depletion process levels off when $X_i = C_i$. At this point the flux of material emerging from the target has the same composition as the bulk distribution. The material is consumed with a bulk-like distribution and therefore the steady state depletion on the surface will be preserved.

The following procedure was followed for the purpose of demonstrating the sputtering process of the invention.

A Vac-Tec Planar Magnetron was used as the RF sputtering cathode. Targets made according to the sol gel method described earlier were metallically bonded on the water cooled backing plate of the magnetron assembly. This configuration allowed stable sputtering of large target pieces, i.e. as thick as 0.15", under very high power density conditions, i.e. up to approximately 100 W/in$^2$, without any performance degradation. The target materials held very well in these harsh conditions with no observable cracking or disproportionation. Deposition rates up to approximately 100 Angstroms/minute at a target/substrate separation of 2.5" were realized.

Sputtering under 3–6 mTorr pressure with a 9–3 Ar/O$_2$ flow ratio were typically used. However, these gas pressures and compositions can vary significantly as known by those skilled in the art without affecting the final film composition.

Replication of the target composition in the sputtered films was confirmed by Rutherford Back Scattering. The independence of the film composition on sputtering conditions allows precise control of the film properties without affecting the predetermined composition. This attribute of the process of the invention is technologically important, since the properties of interest for high silica doped oxides are quite sensitive to variations in composition and morphology.

The films produced by the foregoing process are virtually particle free. This is in contrast to the high particle counts in films of similar composition prepared by RF sputtering processes using mosaic targets structures as described in the prior art. The steady state deposition conditions with targets prepared by the process of the invention were reached in less than five minutes, which indicates the high quality of the target, and predicts a substantial cost and time advantage for these techniques in commercial production. It also reflects very small particle size in the target, i.e. particle sizes below 100 microns, and in many cases, below 50 microns.

An important aspect of the process described herein is the capability of forming large area sputtering targets, e.g. greater than 6 in$^2$. The use of a flotation bed for drying the gel, coupled with the other precautions described, allows drying and consolidation of the gel without excessive cracking or dimensional distortion.

Substrates typically used in this invention are optical or electrical device substrates, e.g. silicon, lithium niobate, lithium tantalate, SiO$_2$, GaAs, InP.

The mixed oxides used in the sol gel formation of the sputtering targets as described herein can be included in the initial mixtures as carbonates or other alternative precursor materials to give essentially equivalent results. Also, in addition to oxides, other relatively refractory compounds such as nitrides or carbides can be used.

Reference is made to the aforementioned patent, U.S. Pat. No. 5,643,346, which is incorporated by reference herein, for more details on the sol-gel process, especially the flotation casting technique.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. Method for depositing a film comprising at least 30 mole % SiO$_2$ by sputtering the film onto a substrate of an optical or electrical device, the method comprising:

a. preparing a sputtering target by the steps of:
      i. combining a silica sol with powder of at least one non-silica oxide to form a sol of particles of different compositions in a suspension medium, said particles and 1–10 mol % non-silica oxide comprising at least 30 mole % SiO$_2$ particles,
      ii. adjusting the pH of the sol to a level in the range 10–13,
      iii. adding an acid gelling agent to said sol to initiate gelling of the sol,
      iv. casting the sol into a mold and allowing the sol to gel,
      v. drying the gelled sol to form a composite body having a mixed composition comprising at least 30 mole % SiO$_2$,
      vi. firing the composite body at a temperature of at least 1000° C. to densify the composite body, and
      vii. forming the composite body into a sputtering target,
   b. mounting the sputtering target produced in steps i–vii in a vacuum chamber,
   c. mounting said substrate in the vacuum chamber,
   d. evacuating the vacuum chamber,
   e. creating an RF potential between said target and said substrate, said RF potential being sufficient to sputter material from the sputtering target and deposit said material on said substrate to thereby produce a layer of deposited material on said substrate, said layer having the same composition as the composition of the sputtering target.

2. The method of claim 1 in which the oxides are selected from the group consisting of $Al_2O_3$, $TiO_2$, $ZrO_2$, $V_2O_5$, BaO, $Ta_2O_5$, SrO, CaO, MgO, $WO_3$, $B_2O_3$, ZnO, CdO, $In_2O_3$, $P_2O_5$, and mixtures thereof.

3. The method of claim 1 in which the pH is adjusted to approximately 9 by the addition of an acid to the sol.

4. The method of claim 1 in which the substrate comprises a material selected from the group consisting of silicon, GaAs, InP and lithium niobate.

5. The method of claim 1 in which the sol is cast onto a flotation bed for drying.

6. The method of claim 1 in which the composite body is fired at a temperature above 1200° C.

7. The method of claim 1 in which the chamber is evacuated and a pressure of flowing gases is controlled in the range 1 to 6 mTorr.

* * * * *